US008034545B2

(12) United States Patent
Sakurai et al.

(10) Patent No.: US 8,034,545 B2
(45) Date of Patent: *Oct. 11, 2011

(54) RADIATION CURABLE COMPOSITION, STORING METHOD THEREOF, FORMING METHOD OF CURED FILM, PATTERNING METHOD, USE OF PATTERN, ELECTRONIC COMPONENTS AND OPTICAL WAVEGUIDE

(75) Inventors: Haruaki Sakurai, Hitachi (JP); Koichi Abe, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/422,760

(22) Filed: Apr. 13, 2009

(65) Prior Publication Data

US 2009/0220897 A1 Sep. 3, 2009

Related U.S. Application Data

(62) Division of application No. 11/167,032, filed as application No. PCT/JP2004/014850 on Oct. 7, 2004, now abandoned.

(30) Foreign Application Priority Data

Oct. 7, 2003 (JP) ................................ P2003-348160
Aug. 25, 2004 (JP) ................................ P2004-245105

(51) Int. Cl.
*G03F 1/00* (2006.01)
*G03F 7/00* (2006.01)

(52) U.S. Cl. ........................................ 430/322; 430/326

(58) Field of Classification Search .................... 430/325
See application file for complete search history.

(56) References Cited

U.S. PATENT DOCUMENTS

| 5,972,560 | A | 10/1999 | Kaneko et al. |
| 6,096,483 | A | 8/2000 | Harkness et al. |
| 6,187,505 | B1 * | 2/2001 | Lin et al. .................... 430/270.1 |
| 6,204,350 | B1 | 3/2001 | Liu et al. |
| 6,207,728 | B1 * | 3/2001 | Sekiguchi et al. .............. 522/83 |
| 6,210,856 | B1 | 4/2001 | Lin et al. |
| 6,342,562 | B1 | 1/2002 | Kozawa et al. |
| 6,344,305 | B1 | 2/2002 | Lin et al. |
| 6,653,045 | B2 | 11/2003 | Angelopoulos et al. |
| 6,731,857 | B2 | 5/2004 | Shelnut et al. |
| 6,737,169 | B2 | 5/2004 | Shimada et al. |

(Continued)

FOREIGN PATENT DOCUMENTS

EP 0814109 A1 12/1997

(Continued)

OTHER PUBLICATIONS

European Search Report dated Nov. 30, 2009, issued in corresponding European Patent Application No. 04792149.

(Continued)

*Primary Examiner* — Cynthia Kelly
*Assistant Examiner* — Chanceity Robinson
(74) *Attorney, Agent, or Firm* — Westerman, Hattori, Daniels & Adrian, LLP

(57) ABSTRACT

The present invention provides a radiation curing composition comprising (a): a siloxane resin, (b): a photoacid generator or photobase generator, and (c): a solvent capable of dissolving component (a) and containing an aprotic solvent.

7 Claims, 5 Drawing Sheets

U.S. PATENT DOCUMENTS

| | | | |
|---|---|---|---|
| 6,821,718 B2 * | 11/2004 | Angelopoulos et al. | 430/325 |
| 6,899,991 B2 | 5/2005 | Kato et al. | |
| 7,108,955 B2 | 9/2006 | Iwasawa et al. | |
| 7,211,365 B2 | 5/2007 | Barclay et al. | |
| 7,297,464 B2 | 11/2007 | Sakurai et al. | |
| 2001/0050741 A1 | 12/2001 | Hokazono et al. | |
| 2002/0172492 A1 | 11/2002 | Shelnut et al. | |
| 2003/0170561 A1 | 9/2003 | Iwasawa et al. | |
| 2003/0171468 A1 | 9/2003 | Nishimura et al. | |
| 2004/0033752 A1 | 2/2004 | Wu et al. | |
| 2004/0048204 A1 | 3/2004 | Angelopoulos et al. | |
| 2005/0266344 A1 | 12/2005 | Sakurai et al. | |

FOREIGN PATENT DOCUMENTS

| | | |
|---|---|---|
| EP | 1265103 A1 | 12/2002 |
| JP | 04-107561 | 4/1992 |
| JP | 4-107561 | 4/1992 |
| JP | 04-366958 | 12/1992 |
| JP | 6-148887 | 5/1994 |
| JP | 06-148895 | 5/1994 |
| JP | 6-148895 | 5/1994 |
| JP | 06-273936 | 9/1994 |
| JP | 6-273936 | 9/1994 |
| JP | 9-263638 A | 10/1997 |
| JP | 10-246960 | 9/1998 |
| JP | 10-324748 | 12/1998 |
| JP | 2000-181069 | 6/2000 |
| JP | 2000-221687 | 8/2000 |
| JP | 2001-5185 A | 1/2001 |
| JP | 2001-83710 A | 3/2001 |
| JP | 2001-215714 | 8/2001 |
| JP | 2001-288364 | 10/2001 |
| JP | 2002-72502 | 3/2002 |
| JP | 2002-107932 | 4/2002 |
| JP | 2003-20335 A | 1/2003 |
| KR | 20020077168 | 10/2002 |
| WO | 03/077029 A1 | 9/2003 |

OTHER PUBLICATIONS

European Search Report dated Jan. 25, 2010, issued in corresponding European Patent Application No. 04792147.

Japanese Office Action dated Dec. 13, 2005, corresponding to Japanese Patent Application No. 2005-511731.

Japanese Office Action dated Aug. 23, 2005; issued in corresponding Japanese Patent Application No. 2005-511731 (Drafting date Aug. 19, 2005).

Japanese Office Action dated Oct. 4, 2005; issued in corresponding Japanese Patent Application No. 2004-372013 (Drafting date Sep. 28, 2005).

Japanese Office Action dated Oct. 4, 2005; issued in corresponding Japanese Patent Application No. 2004-368322 (Drafting date Sep. 28, 2005).

Japanese Office Action dated Mar. 3, 2006; issued in corresponding Japanese Patent Application No. 2005-511731.

Taiwanese Office Action dated Apr. 3, 2006, issued in corresponding Taiwanese Patent Application No. 093130320.

International Search Report, date of Dispatch Dec. 7, 2004, International Patent Application No. PCT/JP2004/014850.

International Preliminary Examination Report for PCT/JP2004/014852 (English version).

Japanese Office Action dated Jul. 28, 2006 (mailing date), issued in corresponding Japanese Patent Application No. 10-2004-7021315.

Japanese Office Action dated Jul. 28, 2006 (mailing date), issued in corresponding Japanese Patent Application No. 10-2004-7021316.

Japanese Office Action dated Mar. 7, 2006 (mailing date), issued in corresponding Japanese Patent Application No. 2005-511731.

Japanese Office Action dated Feb. 14, 2006, corresponding to Japanese Patent Application No. 2004-372013.

Korean Office Action dated Oct. 31, 2007, issued in corresponding Korean Patent Application No. 10-2004-7021315.

Japanese Office Action dated Aug. 23, 2005 (mailing date), issued in corresponding Japanese Patent Application No. 2005-511732.

Japanese Office Action dated Jun. 22, 2010, issued in related Japanese Patent Application No. 2004-372074.

Japanese Office Action dated Jun. 22, 2010, issued in related Japanese Patent Application No. 2005-058123.

* cited by examiner

RADIATION CURABLE COMPOSITION, STORING METHOD THEREOF, FORMING METHOD OF CURED FILM, PATTERNING METHOD, USE OF PATTERN, ELECTRONIC COMPONENTS AND OPTICAL WAVEGUIDE

RELATED APPLICATIONS

This application is a Divisional of U.S. application Ser. No. 11/167,032, filed on Jun. 27, 2005, which is a Continuation in Part of International Application No. PCT/JP2004/014850, filed on Oct. 7, 2004, which are herein incorporated by reference.

BACKGROUND OF THE INVENTION

1. Field of the Invention

The present invention relates to a radiation curable composition, a storing method thereof, a forming method of a cured film, a patterning method, an use of a pattern, electronic components and an optical waveguide.

2. Related Background of the Invention

As insulating films for use in LSIs and PDPs there have conventionally been used $SiO_2$ films formed by CVD methods, and organic SOG (Spin On Glass) or inorganic SOG films formed by coating methods, because of their excellent heat resistance and electrical reliability. With insulating films of the prior art, however, it is impossible to directly form wiring grooves or contact holes, and usually a photoresist is patterned on the insulating film, followed by either dry etching with plasma or wet etching with a chemical solution, after which the film is subjected to a resist removal step or washing step to form a pattern. On the other hand, imparting photosensitive properties to an insulating film material with excellent heat resistance, electrical reliability and transparency eliminates the need for the resist material required in the steps mentioned above, thereby allowing the plasma dry etching, chemical solution wet etching, resist removal and washing steps to be omitted.

In recent years there have been proposed radiation curing polysiloxane materials with excellent heat resistance, electrical reliability and transparency. For example, in Japanese Patent Application Laid-Open No. 6-148895 and Japanese Patent Application Laid-Open No. 10-24696 there are disclosed photosensitive resin compositions comprising an alkali-soluble siloxane polymer, a photoacid generator and a solvent, from which the water and catalyst have been removed. Japanese Patent Application Laid-Open No. 2000-181069 and Japanese Patent Application Laid-Open No. 2002-72502 disclose photosensitive polysilazane compositions comprising polysilazane and a photoacid generator. Also, Japanese Patent Application Laid-Open No. 2001-288364 discloses a radiation curable composition comprising a hydrolyzable silane compound, a photoacid generator and an acid diffusion controller.

SUMMARY OF THE INVENTION

However, when the present inventors conducted a detailed investigation of patterning using such conventional insulating film materials imparted with photosensitive properties, it was found that when employing the photosensitive resin compositions comprising an alkali-soluble siloxane polymer, a photoacid generator and a solvent, from which the water and catalyst have been removed as disclosed in Patent documents 1 and 2, for example, a large light exposure dose is required in both cases, and therefore mass production cannot be advantageously accomplished. In addition, when using the photosensitive polysilazane compositions comprising polysilazane and a photoacid generator, as disclosed in Patent documents 3 and 4, the light exposure dose is low but the steps of dipping in purified water after exposure or steps requiring humidification treatment are obviously complicated, making it difficult to obtain high pattern precision. On the other hand, when using a radiation curable composition comprising a hydrolyzable silane compound, a photoacid generator and an acid diffusion controller, as disclosed in Patent document 5, the acid diffusion controller controls diffusion of the acid generated by the radiation, thereby allowing the pattern precision of the silane compound to be increased. Nevertheless, since the acid diffusion controller inactivates (neutralizes) the acid, the curing property is impaired in cases with a low amount of photoacid generator or a low exposure dose, thereby often leading to lower pattern precision. Conversely, increasing the exposure dose in an attempt to improve the patterning precision is clearly an unsuitable strategy for mass production.

The present invention was accomplished in light of the circumstances described above, and it provides a radiation curable composition which yields a cured product with excellent pattern precision even with a relatively low light exposure dose, a method for its storage, a forming method of a cured film and a patterning method, as well as an use of a pattern, electronic components and an optical waveguide which employ the above.

When forming patterns by generation of acid with radiation according to the prior art, the generated acid is inactivated with an acid diffusion controller to improve the pattern precision. This requires an increased exposure dose for generation of extra acid to compensate for the inactivation, and therefore it has been difficult to achieve both improvement in pattern precision and reduction in exposure dose.

Different strategies that have been considered for controlling diffusion of acid, other than by inactivation of the acid with an acid diffusion controller, include the strategy of reducing the exposure dose to reduce the amount of acid generated, lowering the temperature of the post-exposure baking (PEB) step after exposure, or eliminating the PEB step. However, the basic concepts of such strategies have not been elucidated, nor have radiation curable compositions suited for such strategies existed. A radiation curable composition suited for such strategies would allow formation of highly precise patterns without using an acid diffusion controller. Nevertheless, when patterning is carried out using conventional radiation curable compositions, reducing the amount of acid generated prevents curing from proceeding to an adequate degree. In addition, curing of the exposed sections also fails to adequately proceed when the temperature of the post-exposure baking (PEB) step after exposure is lowered or PEB is not carried out. As a result, it has been difficult to form highly precise patterns.

As a result of much diligent research, the present inventors have completed the present invention after finding that the various problems of the prior art can be overcome by a radiation curable composition comprising specific components, a forming method of a cured film and a patterning method.

The present invention provides a radiation curable composition comprising (a): a siloxane resin, (b): a photoacid generator or photobase generator, and (c): a solvent capable of dissolving component (a) and containing an aprotic solvent.

The invention further provides the aforementioned radiation curable composition wherein the siloxane resin includes a resin obtainable by hydrolytic condensation of a compound represented by the following general formula (1):

$$R^1_n SiX_{4-n} \tag{1}$$

wherein $R^1$ represents an H or F atom, a group containing a B, N, Al, P, Si, Ge or Ti atom, or a C1-20 organic group, X represents a hydrolyzable group and n represents an integer of 0-2, with the proviso that when n is 2, each $R^1$ may be the same or different, and when n is 0-2, each X may be the same or different.

The invention further provides the aforementioned radiation curable composition wherein the aprotic solvent is at least one solvent selected from the group consisting of ether-based solvents, ester-based solvents, ether acetate-based solvents and ketone-based solvents. These aprotic solvents are preferred from the standpoint of sensitivity and pattern precision during pattern formation, and mechanical strength of the cured film.

The invention still further provides the aforementioned radiation curable composition which further comprises component (d): a curing acceleration catalyst. Using a curing acceleration catalyst is preferred because it can heighten the effect of reducing the amount of photoacid generator or photobase generator, the effect of reducing the exposure dose or the effect of lowering the PEB temperature.

The invention still further provides the aforementioned radiation curable composition wherein the curing acceleration catalyst is an onium salt. An onium salt is preferred because it can improve the electrical properties and mechanical strength of the obtained cured film, while also increasing the stability of the composition.

The invention still further provides the aforementioned radiation curable composition wherein the curing acceleration catalyst is a quaternary ammonium salt. Using a quaternary ammonium salt as the curing acceleration catalyst will more notably produce the aforementioned effects of improving the electrical properties and mechanical strength while increasing the stability of the composition.

The invention still further provides a forming method of a cured film comprising steps of applying the aforementioned radiation curable composition onto a substrate and drying it to obtain a coating, and exposing the coating, without heating of the coating after the exposure step. According to this method, diffusion of the acid by heat and increased production costs are adequately minimized, while the pattern precision of the cured film is sufficiently high.

The invention still further provides a forming method of a cured film comprising steps of applying the aforementioned radiation curable composition onto a substrate and drying it to obtain a coating, exposing the coating, and heating the coating after the exposure step.

The invention still further provides a forming method of a cured film comprising steps of applying a radiation curable composition containing a siloxane resin onto a substrate and drying it to obtain a coating, and exposing the coating, without heating of the coating after the exposure step. According to this method, diffusion of the acid by heat and increased production costs are adequately minimized, while the pattern precision of the cured film is sufficiently high.

The invention still further provides a forming method of a cured film comprising steps of applying a radiation curable composition containing a siloxane resin onto a substrate and drying it to obtain a coating, exposing the coating, and heating the coating to 70-110° C. after the exposure step. This method allows greater inhibition of the diffusion of the acid during heating.

The invention still further provides a forming method of a cured film comprising steps of applying a radiation curable composition containing a siloxane resin onto a substrate and drying it to obtain a coating, and exposing the coating to irradiation of light at a dose of 5-100 mJ/cm². A light dose within this range will tend to facilitate control of exposure and improve the productivity.

The invention still further provides a forming method of a cured film comprising steps of applying a radiation curable composition containing a siloxane resin onto a substrate and drying it to obtain a coating, exposing the coating to irradiation of light at a dose of 5-100 mJ/cm², and heating the coating to 70-110° C. after the exposure step.

The invention still further provides the aforementioned forming method of a cured film which employs a radiation curable composition comprising a siloxane resin, wherein the siloxane resin includes a resin obtainable by hydrolytic condensation of a compound represented by the following general formula $$R^1{}_n SiX_{4-n} \tag{1}$$

wherein $R^1$ represents an H or F atom, a group containing a B, N, Al, P, Si, Ge or Ti atom, or a C1-20 organic group, X represents a hydrolyzable group and n represents an integer of 0-2, with the proviso that when n is 2, each $R^1$ may be the same or different, and when n is 0-2, each X may be the same or different.

The invention still further provides a patterning method comprising steps of applying the aforementioned radiation curable composition onto a substrate and drying it to obtain a coating, exposing the coating via a mask and removing the unexposed sections of the coating after the exposure step by development, without heating of the coating after the exposure step. According to this method, diffusion of the acid by heat and increased production costs are adequately minimized, while the pattern precision of the cured film is sufficiently high. The "heat" referred to here means heat at a stage prior to the removal step, and heating may also be carried out after the removal step.

The invention still further provides a patterning method comprising steps of applying the aforementioned radiation curable composition onto a substrate and drying it to obtain a coating, exposing the coating via a mask, heating the coating after the exposure step and removing the unexposed sections of the coating by development after the heating step.

The invention still further provides a patterning method comprising steps of applying a radiation curable composition containing a siloxane resin onto a substrate and drying it to obtain a coating, exposing the coating via a mask, and removing the unexposed sections of the coating by development, without heating of the coating after the exposure step. According to this method, diffusion of the acid by heat and increased production costs are adequately minimized, while the pattern precision of the cured film is sufficiently high. The "heat" referred to here means heat at a stage prior to the removal step, and heating may also be carried out after the removal step.

The invention still further provides a patterning method comprising steps of applying a radiation curable composition containing a siloxane resin onto a substrate and drying it to obtain a coating, exposing the coating via a mask, heating the coating to 70-110° C. after the exposure step, and removing the unexposed sections of the coating by development after the heating step. This method allows greater inhibition of the diffusion of the acid during heating.

The invention still further provides a patterning method comprising a step of applying a radiation curable composition containing a siloxane resin onto a substrate and drying it to obtain a coating, exposing the coating to irradiation of light at a dose of 5-100 mJ/cm² via a mask, and removing the unexposed sections of the coating by development. A light dose within this range will tend to facilitate control of exposure and improve the productivity.

The invention still further provides a patterning method comprising steps of applying a radiation curable composition containing a siloxane resin onto a substrate and drying it to obtain a coating, exposing the coating to irradiation of light at a dose of 5-100 mJ/cm$^2$ via a mask, heating the coating to 70-110° C. after the exposure step, and removing the unexposed sections of the coating by development after the heating step.

The invention still further provides the aforementioned patterning method which employs a radiation curable composition comprising a siloxane resin, wherein the siloxane resin includes a resin obtainable by hydrolytic condensation of a compound represented by the following general formula (1):

$$R^1{}_n SiX_{4-n} \quad (1)$$

wherein R$^1$ represents an H or F atom, a group containing a B, N, Al, P, Si, Ge or Ti atom, or a C1-20 organic group, X represents a hydrolyzable group and n represents an integer of 0-2, with the proviso that when n is 2, each R$^1$ may be the same or different, and when n is 0-2, each X may be the same or different.

The invention still further provides the aforementioned patterning method wherein a tetramethylammonium hydroxide solution is used as the developing solution in the removal step. This method can adequately inhibit contamination of electronic components by alkali metals during development.

The invention still further provides an use of a pattern wherein a pattern formed by the aforementioned patterning method is used as a resist mask.

The invention still further provides an electronic component possessing a pattern formed by the aforementioned patterning method.

The invention still further provides an optical waveguide possessing a pattern formed by the aforementioned patterning method.

The invention still further provides a storage method for the aforementioned radiation curable composition wherein the radiation curable composition is stored at a temperature of 0° C. or below. Storing the composition at a temperature of 0° C. or below will result in greater the storage stability than by storage at a temperature of above 0° C.

The radiation curable composition having this construction, the forming method of a cured film and patterning method using the radiation curable composition, and the storage method for the radiation curable composition allow formation of cured films with excellent pattern precision even using a relatively low exposure dose, thus overcoming the problem of the prior art whereby it has been impossible to achieve both low exposure dose and high pattern precision.

The mechanism responsible for the exhibited effect of the invention, which has not been achieved in the prior art, is not yet fully understood. However, the present inventors conjecture that the reduced exposure dose required for curing according to the invention is realized because, for instance, there is no need to use an acid diffusion controller to inhibit diffusion of generated acid, and an aprotic solvent is used as the solvent to accelerate curing.

When a curing acceleration catalyst is further included as an additive, the effect described above is exhibited more prominently. This is attributed to the fact that the radiation curable composition can be more thoroughly cured at a lower exposure dose.

The improvement in pattern precision is assumed to result because the curing reaction of the radiation curable composition occurs before diffusion of the acid when an aprotic solvent is used as the curing acceleration solvent. Addition of a curing acceleration catalyst as an additive also further improves the pattern precision. This is attributed to the fact that the curing reaction occurs at a more rapid timing. This mechanism differs from the mechanism of the prior art, whereby the acid diffusion controller inactivates (neutralizes) the generated acid to improve the pattern precision. According to the invention, it is conjectured that both pattern precision improvement and exposure dose reduction can be achieved based on the aforementioned mechanism which is different from that of the prior art.

The radiation curable composition, method for its storage, forming method of a cured film and patterning method of the invention can produce cured films with excellent pattern precision at relatively low exposure doses. The present invention is therefore useful for uses of a pattern, electronic components and optical waveguides.

DESCRIPTION OF THE PREFERRED EMBODIMENTS

Figure 1:
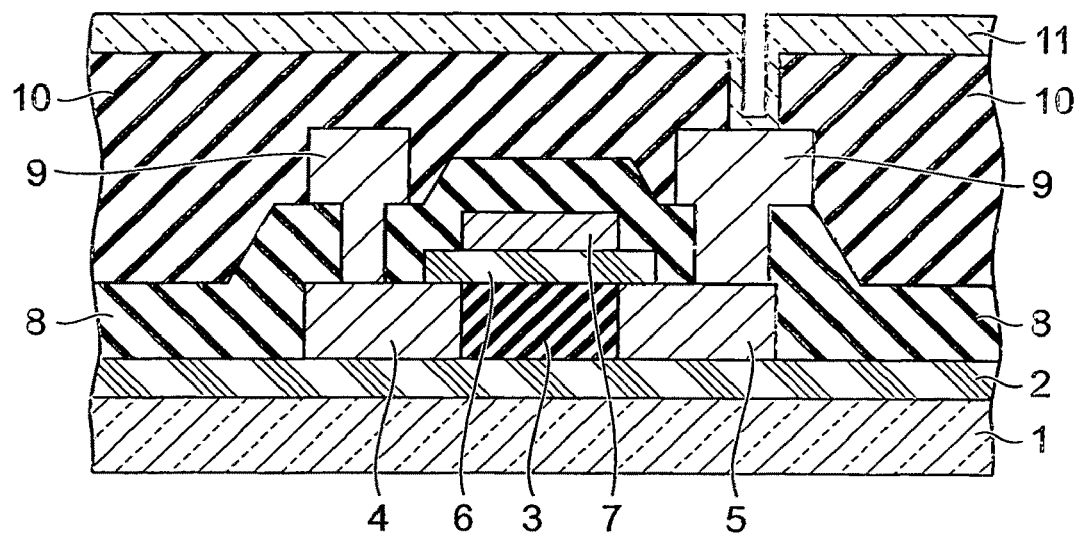
FIG. 1 is a schematic edge-on view of a preferred embodiment of an electronic component according to the invention.

Embodiments of the present invention will now be explained in detail.

<Component (a)>

Component (a) is a siloxane resin, which may be a publicly known one and preferably has OH groups on the ends or the side chains of the resin. This will further promote the hydrolytic condensation reaction for curing of the radiation curable composition.

From the standpoint of solubility in the solvent, mechanical properties and moldability, the siloxane resin preferably has a weight-average molecular weight (Mw) of 500 to 1 million, more preferably 500-500,000, even more preferably 500-100,000, particularly 500-10,000 and most preferably 500-5000. If the weight-average molecular weight is less than 500, the moldability of the cured film will tend to be inferior, while if the weight-average molecular weight is greater than 1 million, the compatibility with solvents will tend to be reduced. Throughout the present specification, the weight-average molecular weight is the value measured by gel permeation chromatography (hereinafter, "GPC") and calculated using a standard polystyrene calibration curve.

The weight-average molecular weight (Mw) may be measured by GPC under the following conditions, for example.

Sample: 10 μL Radiation Curable Composition

Standard polystyrene: Standard polystyrene by Toso Co., Ltd. (molecular weights: 190,000, 17,900, 9100, 2980, 578, 474, 370, 266)

Detector: RI monitor Model "L-3000" by Hitachi, Ltd.

Integrator: GPC integrator Model "D-2200" by Hitachi, Ltd.

Pump: Model "L-6000" by Hitachi, Ltd.
Degas apparatus: Model "Shodex DEGAS" by Showa Denko Co., Ltd.
Column: Models "GL-R440", "GL-R430" and "GL-R420" by Hitachi Chemical Industries, used serially in that order
Eluent: Tetrahydrofuran (THF)
Measuring temperature: 23° C.
Flow rate: 1.75 mL/min
Measuring time: 45 min As examples of preferred siloxane resins there may be mentioned resins obtainable by hydrolytic condensation of any compound represented by the following general formula (1):

$$R^1_n SiX_{4-n} \tag{1}$$

as the essential component. In this formula, $R^1$ represents an H or F atom, a group containing a B, N, Al, P, Si, Ge or Ti atom, or a C1-20 organic group, X represents a hydrolyzable group and n represents an integer of 0-2, and when n is 2, each $R^1$ may be the same or different and when n is 0-2, each X may be the same or different.

As examples for the hydrolyzable group X there may be mentioned alkoxy, halogens, acetoxy, isocyanate and hydroxyl. Among these, alkoxy is preferred from the standpoint of liquid stability and coating properties of the composition itself.

As examples of compounds of general formula (1) wherein the hydrolyzable group X is an alkoxy group (alkoxysilanes) there may be mentioned tetraalkoxysilanes, trialkoxysilanes and dialkoxysilanes.

As examples of tetraalkoxysilanes there may be mentioned tetramethoxysilane, tetraethoxysilane, tetra-n-propoxysilane, tetra-iso-propoxysilane, tetra-n-butoxysilane, tetra-sec-butoxysilane, tetra-tert-butoxysilane and tetraphenoxysilane.

As examples of trialkoxysilanes there may be mentioned trimethoxysilane, triethoxysilane, tripropoxysilane, fluorotrimethoxysilane, fluorotriethoxysilane, methyltrimethoxysilane, methyltriethoxysilane, methyltri-n-propoxysilane, methyltri-iso-propoxysilane, methyltri-n-butoxysilane, methyltri-iso-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-iso-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-iso-butoxysilane, n-propyltri-tert-butoxysilane, n-propyltriphenoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-iso-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-iso-butoxysilane, n-butyltri-tert-butoxysilane, n-butyltriphenoxysilane, sec-butyltrimethoxysilane, sec-butyltriethoxysilane, sec-butyltri-n-propoxysilane, sec-butyltri-iso-propoxysilane, sec-butyltri-n-butoxysilane, sec-butyltri-iso-butoxysilane, sec-butyltri-tert-butoxysilane, sec-butyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-iso-butoxysilane, t-butyltri-tert-butoxysilane, t-butyltriphenoxysilane, phenyltrimethoxysilane, phenyltriethoxysilane, phenyltri-n-propoxysilane, phenyltri-iso-propoxysilane, phenyltri-n-butoxysilane, phenyltri-iso-butoxysilane, phenyltri-tert-butoxysilane, phenyltriphenoxysilane, trifluoromethyltrimethoxysilane, pentafluoroethyltrimethoxysilane, 3,3,3-trifluoropropyltrimethoxysilane and 3,3,3-trifluoropropyltriethoxysilane.

As examples of dialkoxysilanes there may be mentioned dimethyldimethoxysilane, dimethyldiethoxysilane, dimethyldi-n-propoxysilane, dimethyldi-iso-propoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldi-iso-propoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldi-iso-propoxysilane, di-n-propyldi-n-butoxysilane, di-n-propyldi-sec-butoxysilane, di-n-propyldi-tert-butoxysilane, di-n-propyldiphenoxysilane, di-iso-propyldimethoxysilane, di-iso-propyldiethoxysilane, di-iso-propyldi-n-propoxysilane, di-iso-propyldi-iso-propoxysilane, di-iso-propyldi-n-butoxysilane, di-iso-propyldi-sec-butoxysilane, di-iso-propyldi-tert-butoxysilane, di-iso-propyldiphenoxysilane, di-n-butyldimethoxysilane, di-n-butyldiethoxysilane, di-n-butyldi-n-propoxysilane, di-n-butyldi-iso-propoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldi-iso-propoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldi-iso-propoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldi-iso-propoxysilane, diphenyldi-n-butoxysilane, diphenyldi-sec-butoxysilane, diphenyldi-tert-butoxysilane, diphenyldiphenoxysilane, bis(3,3,3-trifluoropropyl)dimethoxysilane and methyl(3,3,3-trifluoropropyl)dimethoxysilane.

As examples of other compounds which are compounds of general formula (1) wherein $R^1$ is a C1-20 organic group there may be mentioned bissilylalkanes and bissilylbenzenes such as bis(trimethoxysilyl)methane, bis(triethoxysilyl)methane, bis(tri-n-propoxysilyl)methane, bis(tri-iso-propoxysilyl)methane, bis(trimethoxysilyl)ethane, bis(triethoxysilyl)ethane, bis(tri-n-propoxysilyl)ethane, bis(tri-iso-propoxysilyl)ethane, bis(trimethoxysilyl)propane, bis(triethoxysilyl)propane, bis(tri-n-propoxysilyl)propane, bis(tri-iso-propoxysilyl)propane, bis(trimethoxysilyl)benzene, bis(triethoxysilyl)benzene, bis(tri-n-propoxysilyl)benzene and bis(tri-iso-propoxysilyl)benzene.

As examples of compounds of general formula (1) wherein $R^1$ is a group containing an Si atom there may be mentioned hexaalkoxydisilanes such as hexamethoxydisilane, hexaethoxydisilane, hexa-n-propoxydisilane and hexa-iso-propoxydisilane, and dialkyltetraalkoxydisilanes such as 1,2-dimethyltetramethoxydisilane, 1,2-dimethyltetraethoxydisilane and 1,2-dimethyltetrapropoxydisilane.

As examples of compounds of general formula (1) wherein the hydrolyzable group X is a halogen atom (halogen group) (halogenated silanes) there may be mentioned these alkoxysilanes having the alkoxy groups in the molecules replaced with halogen atoms. As examples of compounds of general formula (1) wherein the hydrolyzable group X is an acetoxy group (acetoxysilanes) there may be mentioned these alkoxysilanes having the alkoxy groups in the molecules replaced with acetoxy. As examples of compounds of general formula (1) wherein the hydrolyzable group X is an isocyanate group (isocyanatosilanes) there may be mentioned these alkoxysilanes having the alkoxy groups in the molecules replaced with isocyanate. As examples of compounds of general formula (1) wherein the hydrolyzable group X is a hydroxyl group (hydroxysilanes) there may be mentioned these alkoxysilanes having the alkoxy groups in the molecules replaced with hydroxyl.

The compounds represented by general formula (1) may be used alone or in combinations of two or more.

There may also be used resins obtainable by hydrolytic condensation of partial condensates such as oligomers of compounds represented by general formula (1), resins obtainable by hydrolytic condensation of partial condensates such as oligomers of compounds represented by general formula (1) with compounds represented by general formula (1), resins obtainable by hydrolytic condensation of compounds represented by general formula (1) with other compounds, and resins obtainable by hydrolytic condensation of partial condensates such as oligomers of compounds represented by general formula (1) with compounds represented by general formula (1) and other compounds.

As examples of partial condensates such as oligomers of compounds represented by general formula (1) there may be mentioned hexaalkoxydisiloxanes such as hexamethoxydisiloxane, hexaethoxydisiloxane, hexa-n-propoxydisiloxane and hexa-iso-propoxydisiloxane, as well as partially condensed trisiloxane, tetrasiloxane and oligosiloxanes.

As examples of the "other compounds" there may be mentioned compounds having polymerizable double or triple bonds. As examples of compounds having polymerizable double bonds there may be mentioned ethylene, propylene, isobutene, butadiene, isoprene, vinyl chloride, vinyl acetate, vinyl propionate, vinyl caproate, vinyl stearate, methyl vinyl ether, ethyl vinyl ether, propyl vinyl ether, acrylonitrile, styrene, methacrylic acid, methyl methacrylate, ethyl methacrylate, n-propyl methacrylate, iso-propyl methacrylate, n-butyl methacrylate, acrylic acid, methyl acrylate, ethyl acrylate, phenyl acrylate, vinylpyridine, vinylimidazole, acrylamide, acrylbenzene, diallyl benzene, and partially condensed forms of these compounds. As compounds with triple bonds there may be mentioned acetylene, ethynylbenzene and the like.

The resins obtained in this manner may be used alone or in combinations of two or more.

The amount of water used for hydrolytic condensation of the compound represented by general formula (1) is preferably 0.1-1000 moles and more preferably 0.5-100 moles to 1 mole of the compound represented by general formula (1). If the amount of water is less than 0.1 mole, the hydrolytic condensation reaction will tend to proceed inadequately, while if the amount of water is greater than 1000 moles, gel-like matter will tend to be produced during the hydrolysis or condensation.

A catalyst is preferably used for the hydrolytic condensation of the compound represented by general formula (1). As examples of suitable catalysts there may be mentioned acid catalysts, alkali catalysts, metal chelate compounds and the like.

As examples of acid catalysts there may be mentioned organic acids and inorganic acids. As examples of organic acids there may be mentioned formic acid, maleic acid, fumaric acid, phthalic acid, malonic acid, succinic acid, tartaric acid, malic acid, lactic acid, citric acid, acetic acid, propionic acid, butanoic acid, pentanoic acid, hexanoic acid, heptanoic acid, octanoic acid, nonanoic acid, decanoic acid, oxalic acid, adipic acid, sebacic acid, butyric acid, oleic acid, stearic acid, linolic acid, linoleic acid, salicylic acid, benzenesulfonic acid, benzoic acid, p-aminobenzoic acid, p-toluenesulfonic acid, methanesulfonic acid, trifluoromethanesulfonic acid and trifluoroethanesulfonic acid. As examples of inorganic acids there may be mentioned hydrochloric acid, phosphoric acid, nitric acid, boric acid, sulfuric acid and hydrofluoric acid. These may be used alone or in combinations of two or more.

As examples of alkali catalysts there may be mentioned inorganic alkalis and organic alkalis. As examples of inorganic alkalis there may be mentioned sodium hydroxide, potassium hydroxide, rubidium hydroxide and cesium hydroxide. As examples of organic alkalis there may be mentioned pyridine, monoethanolamine, diethanolamine, triethanolamine, dimethylmonoethanolamine, monomethyldiethanolamine, ammonia, tetramethylammoniumhydrooxide, tetraethylammoniumhydrooxide, tetrapropylammoniumhydrooxide, methylamine, ethylamine, propylamine, butylamine, pentylamine, hexylamine, heptylamine, octylamine, nonylamine, decylamine, undecylamine, dodecylamine, cyclopentylamine, cyclohexylamine, N,N-dimethylamine, N,N-diethylamine, N,N-dipropylamine, N,N-dibutylamine, N,N-dipentylamine, N,N-dihexylamine, N,N-dicyclopentylamine, N,N-dicyclohexylamine, trimethylamine, triethylamine, tripropylamine, tributylamine, tripentylamine, trihexylamine, tricyclopentylamine and tricyclohexylamine. These may be used alone or in combinations of two or more.

As examples of metal chelate compounds there may be mentioned metal chelate compounds containing titanium, such as trimethoxy mono(acetylacetonate)titanium, triethoxy mono(acetylacetonate)titanium, tri-n-propoxy mono(acetylacetonate)titanium, tri-iso-propoxy mono(acetylacetonate)titanium, tri-n-butoxy mono(acetylacetonate)titanium, tri-sec-butoxy mono(acetylacetonate)titanium, tri-tert-butoxy mono(acetylacetonate)titanium, dimethoxy di(acetylacetonate)titanium, diethoxy di(acetylacetonate)titanium, di-n-propoxy di(acetylacetonate)titanium, di-iso-propoxy di(acetylacetonate)titanium, di-n-butoxy di(acetylacetonate)titanium, di-sec-butoxy di(acetylacetonate)titanium, di-tert-butoxy di(acetylacetonate)titanium, monomethoxy tris(acetylacetonate)titanium, monoethoxy tris(acetylacetonate)titanium, mono-n-propoxy tris(acetylacetonate)titanium, mono-iso-propoxy tris(acetylacetonate)titanium, mono-n-butoxy tris(acetylacetonate)titanium, mono-sec-butoxy tris(acetylacetonate)titanium, mono-tert-butoxy tris(acetylacetonate)titanium, tetrakis(acetylacetonate)titanium, trimethoxy mono(ethylacetoacetate)titanium, triethoxy mono(ethylacetoacetate)titanium, tri-n-propoxy mono(ethylacetoacetate)titanium, tri-iso-propoxy mono(ethylacetoacetate)titanium, tri-n-butoxy mono(ethylacetoacetate)titanium, tri-sec-butoxy mono(ethylacetoacetate)titanium, tri-tert-butoxy mono(ethylacetoacetate)titanium, dimethoxy di(ethylacetoacetate)titanium, diethoxy di(ethylacetoacetate)titanium, di-n-propoxy di(ethylacetoacetate)titanium, di-iso-propoxy di(ethylacetoacetate)titanium, di-n-butoxy di(ethylacetoacetate)titanium, di-sec-butoxy di(ethylacetoacetate)titanium, di-tert-butoxy di(ethylacetoacetate)titanium, monomethoxy tris(ethylacetoacetate)titanium, monoethoxy tris(ethylacetoacetate)titanium, mono-n-propoxy tris(ethylacetoacetate)titanium, mono-iso-propoxy tris(ethylacetoacetate)titanium, mono-n-butoxy tris(ethylacetoacetate)titanium, mono-sec-butoxy tris(ethylacetoacetate)titanium, mono-tert-butoxy tris(ethylacetoacetate)titanium and tetrakis(ethylacetoacetate)titanium, as well as the aforementioned titanium-containing metal chelate compounds wherein the titanium is replaced with zirconium, aluminum or the like. These may also be used alone or in combinations of two or more.

The hydrolysis of the compound represented by general formula (1) is preferably carried out using such catalysts mentioned above, but in some cases the stability of the composition may be impaired or inclusion of the catalyst may have adverse effects such as corrosion of other materials. In such cases, the hydrolysis may be followed by, for example, removal of the catalyst from the composition or reaction with other compounds to inactivate the function of the catalyst. There are no particular restrictions on the method of removal or the method of reaction, and removal may be accomplished by distillation or by ion chromatography. The hydrolysate obtained from the compound represented by general formula (1) may also be removed from the composition by reprecipitation or the like. As an example of a method for inactivating the function of the catalyst by reaction, if the catalyst is an alkali catalyst, there may be mentioned a method of adding an acid catalyst for neutralization by acid-base reaction, or for adjustment of the pH toward the acidic end.

The amount of catalyst used is preferably in the range of 0.0001-1 mole to 1 mole of the compound represented by general formula (1). The reaction may not proceed substantially if the amount used is less than 0.0001 mole, while gelling may be promoted during the hydrolytic condensation if the amount is greater than 1 mole.

The alcohol by-product of hydrolysis is a protic solvent and is therefore preferably removed using an evaporator or the like.

The resin obtained in this manner, from the standpoint of solubility in the solvent, mechanical properties and moldability, preferably has a weight-average molecular weight (Mw) of 500 to 1 million, more preferably 500-500,000, even more preferably 500-100,000, particularly 500-10,000 and most preferably 500-5000. If the weight-average molecular weight is less than 500, the moldability of the cured film will tend to be inferior, while if the weight-average molecular weight is greater than 1 million, the compatibility with solvents will tend to be reduced.

When adhesion to ground layers and mechanical strength are required, the total proportion of the one or more atoms selected from the group consisting of H, F, B, N, Al, P, Si, Ge, Ti and C atoms with respect to the Si atoms in general formula (1) (hereunder, this will be referred to as the total number (M) of specific bonding atoms ($R^1$ in general formula (1))) is preferably 1.3-0.2 mole, more preferably 1.0-0.2 mole, even more preferably 0.90-0.2 mole and most preferably 0.8-0.2 mole. This will prevent reduction in adhesion to other films (layers) and mechanical strength of the cured film.

If the total number (M) of specific bonding atoms is less than 0.20, the dielectric properties of the cured film as an insulating film will tend to be inferior, while if it is greater than 1.3, the finally obtained cured film will tend to have poorer adhesion to other films (layers) and mechanical strength. Among these specific bonding atoms, the cured film preferably contains one or more atoms selected from the group consisting of H, F, N, Si, Ti and C from the standpoint of moldability, and it preferably contains one or more selected from the group consisting of H, F, N, Si and C from the standpoint of dielectric properties and mechanical strength.

The total number (M) of specific bonding atoms may be determined from the charging volume of the siloxane resin, and for example, it may be calculated using the relationship represented by the following formula (A):

$$M=(M1+(M2/2)+(M3/3))/Msi \quad (A)$$

In this formula, M1 represents the total number of atoms bonded with (only) one Si atom among the specific bonding atoms, M2 represents the total number of atoms bonded to two silicon atoms among the specific bonding atoms, M3 represents the total number of atoms bonded to three silicon atoms among the specific bonding atoms, and Msi represents the total number of Si atoms.

Such siloxane resins may be used alone or in combinations of two or more. As methods for combining two or more siloxane resins there may be mentioned, for example, a method of combining two or more different siloxane resins having different weight-average molecular weights, and a method of combining two or more different siloxane resins obtainable by hydrolytic condensation with different compounds as essential components.

<Component (b)>

Component (b) is a photoacid generator or photobase generator, and it is defined as a compound capable of releasing an acidic activator or basic activator which can promote photocuring (hydrolytic polycondensation) of component (a) by exposure to radiation.

As examples of photoacid generators there may be mentioned diarylsulfonium salts, triarylsulfonium salts, dialkylphenacylsulfonium salts, diaryliodonium salts, aryldiazonium salts, aromatic tetracarboxylic acid esters, aromatic sulfonic acid esters, nitrobenzyl esters oximesulfonic acid esters, aromatic N-oximidesulfonates, aromatic sulfamides, haloalkyl group-containing hydrocarbon-based compounds, haloalkyl group-containing heterocyclic compounds and naphthoquinonediazido-4-sulfonic acid esters. These may be used alone or in combinations of two or more. They may also be used in combination with other sensitizing agents or the like.

As examples of photobase generators there may be mentioned the group of compounds represented by general formulas (2) to (5) below, nonionic photobase generators such as nifedipines, cobaltamine complexes, ionic photobase generators such as the quaternary ammonium salts represented by general formulas (6) and (7) below, and the like. These may be used alone or in combinations of two or more. They may also be used in combination with other sensitizing agents or the like.

$$(R^2\text{—OCO—NH})_m\text{—}R^3 \quad (2)$$

In this formula, $R^2$ represents a C1-30 monovalent organic group which may include an aromatic ring with a methoxy group or nitro group on a side chain, $R^3$ represents a C1-20 monovalent to tetravalent organic group, and m represents an integer of 1-4.

$$(R^4R^5C\!\!=\!\!N\text{—OCO})_m\text{—}R^3 \quad (3)$$

In this formula, $R^3$ and m have the same definitions as for general formula (2), and $R^4$ and $R^5$ each independently represent C1-30 monovalent organic groups, which may together form a cyclic structure.

$$R^2\text{—OCO—NR}^6R^7 \quad (4)$$

In this formula, $R^2$ has the same definition as for general formula (2), and $R^6$ and $R^7$ each independently represent C1-30 monovalent organic groups, which may together form a cyclic structure, and one of which may be a hydrogen atom.

$$R^8\text{—CO—}R^9\text{—NR}^6R^7 \quad (5)$$

In this formula, $R^6$ and $R^7$ have the same definitions as for general formula (4), $R^8$ represents a C1-30 monovalent organic group which may include an aromatic ring with an alkoxy, nitro, amino, alkyl-substituted amino or alkylthio group on a side chain, and $R^9$ represents a C1-30 divalent organic group.

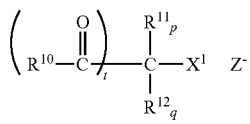
(6)

In this formula, $R^{10}$ represents a C1-30 monovalent organic group, $R^{11}$ and $R^{12}$ each independently represent a C1-30 organic group or hydrogen atom, $X^1$ represents a monovalent group represented by any one of general formulas (6A), (6B), (6C), (6D), (6E) and (6F) below (hereinafter referred to as "(6A) to (6F)"), $Z^-$ represents the counter ion of the ammonium salt, t represents an integer of 1-3, p and q represent integers of 0-2 and t+p+q=3.

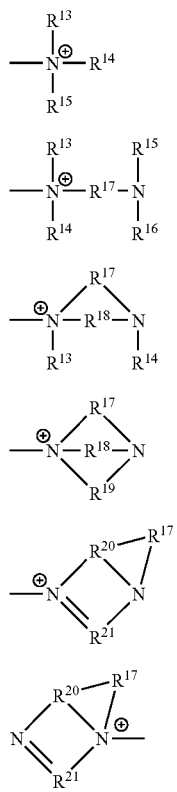

(6A)

(6B)

(6C)

(6D)

(6E)

(6F)

In these formulas, $R^{13}$, $R^{14}$, $R^{15}$ and $R^{16}$ each independently represent a C1-30 monovalent organic group, $R^{17}$, $R^{18}$ and $R^{19}$ each independently represent a C1-30 divalent organic group or a single bond, and $R^{20}$ and $R^{21}$ each independently represent a C1-30 trivalent organic group.

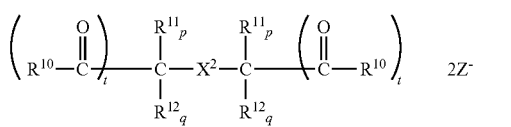
(7)

In this formula, $R^{10}$, $R^{11}$, $R^{12}$, $Z^-$, t, p and q are the same as in general formula (6) above, and $X^2$ represents a divalent group represented by any one of general formulas (7A) to (7D) below.

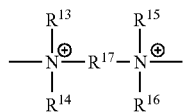
(7A)

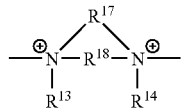
(7B)

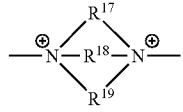
(7C)

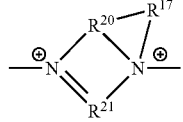
(7D)

In these formulas, $R^{13}$, $R^{14}$, $R^{15}$, $R^{16}$, $R^{17}$, $R^{18}$, $R^{19}$, $R^{20}$ and $R^{21}$ have the same definitions as in general formulas (6A) to (6F) above.

The amount of component (b) used is not particularly restricted, and may be selected from a wide range since it will depend on the sensitivity and efficiency of the photoacid generator or photobase generator used, the light source used, the thickness of the desired cured film, etc. Specifically, the amount of component (b) used is preferably 0.0001-50 wt %, more preferably 0.001-20 wt % and even more preferably 0.01-10 wt % with respect to the total amount of component (a) in the radiation curable composition. If the amount used is less than 0.0001 wt %, the photocuring property will tend to be reduced or a greater exposure dose will tend to be necessary for curing, while if it exceeds 50 wt %, the stability and film-forming property of the composition will tend to be inferior, and the electrical properties and process adaptability of the cured film will tend to be reduced.

A photosensitizing agent may be used together with the aforementioned photoacid generator or photobase generator. Using a photosensitizing agent will allow efficient absorption of the radiation energy beam, thereby improving the sensitivity of the photoacid generator or photobase generator. As examples of photosensitizing agents there may be mentioned anthracene derivatives, perylene derivatives, anthraquinone derivatives, thioxanthone derivatives, coumarin and the like.

When the radiation curable composition is separated into two solutions for storage, component (b) and component (a) may be stored separately for increased storage stability.

When the radiation curable composition is to be stored overnight, it is preferably stored at a temperature of, for example, 0° C. or below. The lower limit for the temperature is preferably above the congealing point of the solvent in the radiation curable composition, and more preferably −50° C.

<Component (c)>

Protic solvents, typically alcohols, have a hydrogen atom bonded to an oxygen atom exhibiting high electronegativity. Consequently, the protic solvent molecules solvate by forming hydrogen bonds with nucleophilic reagents and the like. Specifically, since protic solvents solvate with siloxane resins obtained by hydrolysis of compounds represented by general formula (1), the solvent molecules must be removed in order to condense the siloxane resin, as they tend to inhibit curing at low temperature.

Aprotic solvents, on the other hand, are solvents without hydrogen atoms on highly electronegative elements, and are therefore less a cause of reaction inhibition than are protic solvents. Consequently, curing reaction proceeds with generation of acidic active substances and basic active substances at the exposed sections, thereby minimizing any reduction in pattern precision due to diffusion of the acid or base, so that the pattern precision is improved. This is a different mechanism from that of the prior art whereby the acid diffusion controller inactivates (neutralizes) the generated acid to improve the pattern precision. According to the invention, both pattern precision improvement and exposure dose reduction are presumably achieved in this manner.

As examples of aprotic solvents in component (c) there may be mentioned ketone-based solvents such as acetone, methyl ethyl ketone, methyl-n-propyl ketone, methyl-isopropyl ketone, methyl-n-butyl ketone, methyl-iso-butyl ketone, methyl-n-pentyl ketone, methyl-n-hexylketone, diethylketone, dipropyl ketone, di-iso-butyl ketone, trimethyl nonanone, cyclohexanone, cyclopentanone, methylcyclohexanone, 2,4-pentanedione, acetonylacetone, γ-butyrolactone and γ-valerolactone; ether-based solvents such as diethyl ether, methylethyl ether, methyl-n-propyl ether, di-n-propyl ether, di-iso-propyl ether, tetrahydrofuran, methyltetrahydrofuran, dioxane, dimethyldioxane, ethyleneglycol dimethyl ether, ethyleneglycol diethyl ether, ethyleneglycol di-n-propyl ether, ethyleneglycol dibutyl ether, diethyleneglycol dimethyl ether, diethyleneglycol diethyl ether, diethyleneglycol methylethyl ether, diethyleneglycol methylmono-n-propyl ether, diethyleneglycol methylmono-n-butyl ether, diethyleneglycol di-n-propyl ether, diethyleneglycoldi-n-butyl ether, diethyleneglycol methylmono-n-hexyl ether, triethyleneglycol dimethyl ether, triethyleneglycol diethyl ether, triethyleneglycol methylethyl ether, triethyleneglycol methylmono-n-butyl ether, triethyleneglycol di-n-butyl ether, triethyleneglycol methylmono-n-hexyl ether, tetraethyleneglycol dimethyl ether, tetraethyleneglycol diethyl ether, tetradiethyleneglycol methylethyl ether, tetraethyleneglycol methylmono-n-butyl ether, tetraethyleneglycol methylmono-n-hexyl ether, tetraethyleneglycol di-n-butyl ether, propyleneglycol dimethyl ether, propyleneglycol diethyl ether, propyleneglycol di-n-propyl ether, propyleneglycol dibutyl ether, dipropyleneglycol dimethyl ether, dipropyleneglycol diethyl ether, dipropyleneglycol methylethyl ether, dipropyleneglycol methylmono-n-butyl ether, dipropyleneglycol di-n-propyl ether, dipropyleneglycol di-n-butyl ether, dipropyleneglycol methylmono-n-hexyl ether, tripropyleneglycol dimethyl ether, tripropyleneglycol diethyl ether, tripropyleneglycol methylethyl ether, tripropyleneglycol methylmono-n-butyl ether, tripropyleneglycol di-n-butyl ether, tripropyleneglycol methylmono-n-hexyl ether, tetrapropyleneglycol dimethyl ether, tetrapropyleneglycol diethyl ether, tetrapropyleneglycol methylethyl ether, tetrapropyleneglycol methylmono-n-butyl ether, tetrapropyleneglycol methylmono-n-hexyl ether and tetrapropyleneglycol di-n-butyl ether; ester-based solvents such as methyl acetate, ethyl acetate, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, nonyl acetate, methyl acetoacetate, ethyl acetoacetate, acetic acid diethyleneglycol monomethyl ether, acetic acid diethyleneglycol monoethyl ether, acetic acid diethyleneglycol mono-n-butyl ether, acetic acid dipropyleneglycol monomethyl ether, acetic acid dipropyleneglycol monoethyl ether, diacetic acid glycol, acetic acid methoxy triglycol, ethyl propionate, n-butyl propionate, i-amyl propionate, diethyl oxalate and di-n-butyl oxalate; ether acetate-based solvents such as ethyleneglycol methyl ether propionate, ethyleneglycol ethyl ether propionate, ethyleneglycol methyl ether acetate, ethyleneglycol ethyl ether acetate, diethyleneglycol methyl ether acetate, diethyleneglycol ethyl ether acetate, diethyleneglycol-n-butyl ether acetate, propyleneglycol methyl ether acetate, propyleneglycol ethyl ether acetate, propyleneglycol propyl ether acetate, dipropyleneglycol methyl ether acetate and dipropyleneglycol ethyl ether acetate; and acetonitrile, N-methylpyrrolidinone, N-ethylpyrrolidinone, N-propylpyrrolidinone, N-butylpyrrolidinone, N-hexylpyrrolidinone, N-cyclohexylpyrrolidinone, N,N-dimethylformamide, N,N-dimethylacetamide, N,N-dimethylsulfoxide and the like. From the standpoint of sensitivity and pattern precision during pattern formation and mechanical strength of the cured film, ether-based solvents, ester-based solvents, ether acetate-based solvents and ketone-based solvents are preferred. Solvents containing no nitrogen are also preferred. Among these, it is the opinion of the present inventors that ether acetate-based solvents are the most preferable, ether-based solvents are the second most preferable, and ketone-based solvents are the third most preferable. They may be used alone or in combinations of two or more.

When the stability of the radiation curable composition is considered, component (c) is preferably soluble in water or has the solubility of water, and more preferably it is soluble in water and has the solubility of water. Thus, a protic solvent is preferably added when the aprotic solvent is not soluble in water or does not have the solubility of water. When the aprotic solvent is not soluble in water or does not have the solubility of water, and contains no protic solvent, the compatibility with the solvent of component (a) will be reduced, tending to lower the stability. However, if sensitivity is desired even at the expense of some degree of stability, a smaller amount of protic solvent is preferred.

As examples of such protic solvents there may be mentioned alcohol-based solvents such as methanol, ethanol, n-propanol, i-propanol, n-butanol, i-butanol, sec-butanol, t-butanol, n-pentanol, i-pentanol, 2-methylbutanol, sec-pentanol, t-pentanol, 3-methoxybutanol, n-hexanol, 2-methylpentanol, sec-hexanol, 2-ethylbutanol, sec-heptanol, n-octanol, 2-ethylhexanol, sec-octanol, n-nonyl alcohol, n-decanol, sec-undecyl alcohol, trimethylnonyl alcohol, sec-tetradecyl alcohol, sec-heptadecyl alcohol, phenol, cyclohexanol, methylcyclohexanol, benzyl alcohol, ethylene glycol, 1,2-propylene glycol, 1,3-butylene glycol, diethylene glycol, dipropylene glycol, triethylene glycol and tripropylene glycol; ether-based solvents such as ethyleneglycol methyl ether, ethyleneglycol ethyl ether, ethyleneglycol monophenyl ether, diethyleneglycol monomethyl ether, diethyleneglycol monoethyl ether, diethyleneglycol mono-n-butyl ether, diethyleneglycol mono-n-hexyl ether, ethoxytriglycol, tetraethyleneglycol mono-n-butyl ether, propyleneglycol monomethyl ether, dipropyleneglycol monomethyl ether, dipropyleneglycol monoethyl ether and tripropyleneglycol monomethyl ether; and ester-based solvents such as methyl lactate, ethyl lactate, n-butyl lactate and n-amyl lactate. These may be used alone or in combinations of two or more.

The proportion of the aprotic solvent used is preferably at least 50 wt %, more preferably at least 70 wt %, even more preferably at least 90 wt % and most preferably at least 95 wt % of the total solvent. If the proportion is too low, the exposed sections will tend to be inadequately cured with a low exposure dose. A low proportion may also require heat treatment at high temperature for adequate curing, while diffusion of the generated acid or base will be more likely and the pattern precision will tend to be reduced.

The method of using component (c) is not particularly restricted, and for example, it may be a method of using it as a solvent for preparation of component (a), an addition method or a solvent-exchange method after preparation of component (a), or a method of adding the solvent (c) after removing component (a) by solvent distillation or the like.

The radiation curable composition of the invention may also contain water if necessary, but preferably in a range which does not impair the desired characteristics. The amount of water used is preferably no greater than 10 wt %, more preferably no greater than 5 wt % and even more preferably no greater than 2 wt % with respect to the total amount of the radiation curable composition. If the amount of water used exceeds 10 wt %, the coatability and coating solution stability will tend to be inferior. Although the exact reason is unknown, addition of a small amount of water can sometimes permit reduction of the exposure dose.

The amount of solvent used (the total of the aprotic solvent and protic solvent) is preferably an amount which gives a concentration of 3-60 wt % for component (a) (siloxane resin). If the amount of solvent is excessive so that the concentration of component (a) is less than 3 wt %, it will tend to be difficult to form a cured film with the desired film thickness, while if the amount of solvent is insufficient so that the concentration of component (a) is greater than 60 wt %, the film-forming property of the cured film will be poor and the stability of the composition itself will tend to be reduced.

<Component (d)>

Component (d) according to the invention is a curing acceleration catalyst, and its addition to the radiation curable composition is preferred because it can enhance the effect of reducing the amount of the photoacid generator or photobase generator required, the effect of reducing the exposure dose required and the effect of lowering the PEB temperature. The curing acceleration catalyst differs from an ordinary photoacid generator or photobase generator for component (b) which generates an active substance by light. It will therefore usually be distinguished from an onium salt used as the photoacid generator or photobase generator. Nevertheless, a material which comprises both the photoacid generator or photobase generator and the curing acceleration catalyst may be used.

The catalyst may be a specific one which does not exhibit a catalytic effect in solution but exhibits its activity in the coating after application. Presumably, since the curing reaction accelerated by the curing acceleration catalyst proceeds simultaneously with generation of an acidic active substance or basic active substance at the exposed sections, the reduction in the pattern precision due to diffusion of the acid or base is further inhibited, or in other words, the pattern precision is further improved.

A process for determining the curing acceleration catalyst power of the curing acceleration catalyst will now be explained in four steps.

1. A composition comprising component (a) and component (c) is prepared.

2. The composition prepared in 1. above is applied onto a silicon wafer so that the post-baking film thickness is 1.0±0.1 μm, and then baked for 30 seconds at a prescribed temperature, and the film thickness of the coating is measured.

3. The coating-formed silicon wafer is immersed for 30 seconds into a 2.38 wt % tetramethylammonium hydroxide (TMAH) aqueous solution at 23±2° C., washed and dried, and then the coating film loss is observed. The insolubility temperature is defined as the minimum temperature during baking at which the change in the coating film thickness before and after immersion in the TMAH aqueous solution is less than 20%.

4. The compound whose curing acceleration catalyst power is to be confirmed is added to the composition prepared in 1. above at 0.01 wt % to obtain a composition, and the insolubility temperature is determined in the same manner as 2. and 3. above. If the insolubility temperature is lowered by addition of the compound whose curing acceleration catalyst power is to be confirmed, the compound is judged as having curing acceleration catalyst power.

As examples of the curing acceleration catalyst of component (d) there may be mentioned alkali metals such as sodium hydroxide, sodium chloride, potassium hydroxide and potassium chloride, and onium salts. These may be used alone or in combinations of two or more.

Onium salts are preferred among these, with quaternary ammonium salts being more preferred, from the standpoint of improving the electrical properties and mechanical strength of the obtained cured film while also increasing the stability of the composition.

One example of an onium salt compound which may be mentioned is a salt formed from (d-1) a nitrogen-containing compound and (d-2) at least one selected from among anionic group-containing compounds and halogen atoms. The atom bonded to the nitrogen of the (d-1) nitrogen-containing compound is preferably at least one selected from the group consisting of H, F, B, N, Al, P, Si, Ge, Ti and C atoms. As examples of anionic groups there may be mentioned hydroxyl, nitrate, sulfate, carbonyl, carboxyl, carbonate and phenoxy.

As examples of onium salt compounds there may be mentioned ammonium salt compounds such as ammonium hydroxide, ammonium fluoride, ammonium chloride, ammonium bromide, ammonium iodide, ammonium phosphate, ammonium nitrate, ammonium borate, ammonium sulfate, ammonium formate, ammonium maleate, ammonium fumarate, ammonium phthalate, ammonium malonate, ammonium succinate, ammonium tartrate, ammonium malate, ammonium lactate, ammonium citrate, ammonium acetate, ammonium propionate, ammonium butanoate, ammonium pentanoate, ammonium hexanoate, ammonium heptanoate, ammonium octanoate, ammonium nonanoate, ammonium decanoate, ammonium oxalate, ammonium adipate, ammonium sebacate, ammonium butyrate, ammonium oleate, ammonium stearate, ammonium linolate, ammonium linoleate, ammonium salicylate, ammonium benzenesulfonate, ammonium benzoate, ammonium p-aminobenzoate, ammonium p-toluenesulfonate, ammonium methanesulfonate, ammonium trifluoromethanesulfonate and ammonium trifluoroethanesulfonate.

There may also be mentioned the aforementioned ammonium salt compounds wherein the ammonium portion of the ammonium salt compounds are replaced with methyl ammonium, dimethyl ammonium, trimethyl ammonium, tetramethyl ammonium, ethyl ammonium, diethyl ammonium, triethyl ammonium, tetraethyl ammonium, propyl ammonium, dipropyl ammonium, tripropyl ammonium, tetrapropyl ammonium, butyl ammonium, dibutyl ammonium, tributyl ammonium, tetrabutyl ammonium, ethanol ammonium, diethanol ammonium or triethanol ammonium.

Among these onium salt compounds there are preferred tetramethylammonium nitrate, tetramethylammonium acetate, tetramethylammonium propionate, tetramethylammonium maleate and tetramethylammonium sulfate, from the standpoint of curing acceleration for the cured film.

These may be used alone or in combinations of two or more.

The amount of component (d) used is preferably 0.0001-5 wt % and more preferably 0.0001-1 wt %, with respect to the total amount of component (a) in the radiation curable composition. If the amount used is less than 0.0001 wt %, a greater exposure dose will tend to be necessary for curing. If the amount used is greater than 5 wt %, the stability and film-forming property of the composition will tend to be poor, while the electrical properties and process adaptability of the cured film will tend to be reduced.

From the viewpoint of sensitivity and stability, the amount of the curing acceleration catalyst of component (d) used is preferably 0.0001-0.1 wt %, more preferably 0.0001-0.05 wt % and even more preferably 0.0005-0.01 wt % with respect to the total amount of component (a) in the radiation curable composition.

These onium salts may also be added after dissolution or dilution to the prescribed concentration in water or another solvent, as necessary. There are no particular restrictions on the timing for the addition, and for example, it may be carried out at the start of hydrolysis of component (a), during the hydrolysis, after completion of the reaction, before or after solvent distillation or at the point of adding the acid generator.

<Other Components>

A pigment may also be added to the radiation curable composition of the invention. Addition of a pigment can produce a sensitivity-adjusting effect or a stationary wave-inhibiting effect.

In addition, surfactants, silane coupling agents, thickeners, inorganic fillers, thermal decomposing compounds such as polypropylene glycol, volatile compounds and the like may be added in ranges which do not interfere with the object or effect of the invention. Thermal decomposing compounds and volatile compounds decompose or volatilize by heat (preferably 250-500° C.), and preferably are capable of forming gaps. The siloxane resin as component (a) may also exhibit a gap-forming property.

When the radiation curable composition of the invention is to be used in an electronic component, it preferably contains no alkali metal or alkaline earth metal, or maximally at a metal ion concentration of no greater than 1000 ppm and more preferably no greater than 1 ppm in the composition. If the concentration of these metal ions is greater than 1000 ppm, the metal ions will more readily enter into the electronic component, e.g. semiconductor element comprising the cured film obtained from the composition, potentially having an adverse effect on the device performance. Thus, if necessary, it may be effective to remove the alkali metals or alkaline earth metals from the composition using an ion-exchange filter, for example. However, no such restriction exists for use as an optical waveguide or for other uses, so long as the intended purpose is not impeded.

A method of forming a patterned cured film on a substrate using a radiation curable composition of the invention will now be explained through an example of a spin coating method, which generally has excellent film formability and film uniformity. However, the forming method of a cured film is not limited to a spin coating method. Also, the substrate may have a flat surface or it may be irregular, with electrodes or the like formed therein.

First, the radiation curable composition is coated onto a substrate such as a silicon wafer or glass substrate at preferably 500-5000 rpm and more preferably 500-3000 rpm to form a coating. If the rotation rate is less than 500 rpm, the film uniformity will tend to be poor, and if the rotation rate is greater than 5000 rpm, the film-forming property may be impaired.

The film thickness of the cured film will differ depending on the intended use, and for example, the film thickness for use as an interlayer insulating film in an LSI or the like is preferably 0.01-2 μm, while the film thickness is preferably 2-40 μm for use as a passivation layer. The film thickness for liquid crystal uses is preferably 0.1-20 μm, the film thickness for photoresist uses is preferably 0.1-2 μm, and the film thickness for optical waveguide uses is preferably 1-50 μm. Generally speaking, the film thickness will be preferably 0.01-10 μm, more preferably 0.01-5 μm, even more preferably 0.01-3 μm, still more preferably 0.01-2 μm and most preferably 0.1-2 μm. The concentration of component (a) in the composition may be adjusted to control the film thickness of the cured film. When a spin coating method is used, the film thickness may be controlled by adjusting the rotation rate and number of applications. When the film thickness is controlled by adjusting the concentration of component (a), the concentration of component (a) may be increased for a greater film thickness or the concentration of component (a) may be decreased for a smaller film thickness. When the film thickness is controlled using a spin coating method, the rotation rate may be decreased or the number of applications increased for a greater film thickness, or alternatively the rotation rate may be increased or the number applications decreased for a smaller film thickness.

The solvent in the coating is then dried with a hot plate at preferably 50-200° C. and more preferably 70-150° C., and the drying temperature must be adjusted so that the coating will dissolve under the conditions used for subsequent development. If the drying temperature is below 50° C., drying of the solvent will tend to be inadequate, and if it is above 200° C., the film may not dissolve during development and a pattern may not be formed.

Next, the film is exposed to radiation via a mask having the desired pattern. The exposure dose is preferably 5-5000 mJ/cm$^2$, more preferably 5-1000 mJ/cm$^2$, even more preferably 5-500 mJ/cm$^2$ and most preferably 5-100 mJ/cm$^2$. If the exposure dose is less than 5 mJ/cm$^2$ it may be difficult to achieve control depending on the light source, and if it is greater than 5000 mJ/cm$^2$ the exposure time will be longer, tending to lower productivity. The exposure dose for an ordinary siloxane-based radiation curable composition of the prior art is about 500-5000 mJ/cm$^2$.

The radiation employed may be visible light, ultraviolet light, infrared light, X-rays, α-rays, β-rays, γ-rays or the like, although ultraviolet rays are particularly preferred. As examples of ultraviolet ray generating sources there may be mentioned ultrahigh voltage mercury lamps, high voltage mercury lamps, low voltage mercury lamps, metal halide lamps and excimer lamps.

The unexposed sections are adequately soluble in the developing solution, but acidic active substances or basic active substances are generated at the exposed sections, producing hydrolytic condensation reaction and lowering the solubility in the developing solution. This results in formation of a pattern.

If necessary, the exposure may be followed by a heating step (post-exposure baking: PEB). The heating may be accomplished by heating the coating on a hot plate or the like, and preferably the heating is in a temperature range at which the solubility of the unexposed sections in the developing solution is not lowered. The temperature is preferably 50-200° C., more preferably 70-150° C., even more preferably 70-110° C. and most preferably 70-100° C. A lower temperature is preferred because a higher temperature will tend to facilitate diffusion of the generated acid. The heating temperature is usually about 115-120° C. in the PEB step for an ordinary siloxane-based radiation curable composition of the prior art.

A developing solution such as an aqueous alkali solution may be used for development, i.e. for removal of the unexposed sections of the radiation curable composition. As examples of aqueous alkali solutions there may be mentioned inorganic alkalis such as sodium hydroxide, potassium hydroxide, sodium carbonate, sodium silicate, sodium metasilicate and ammonia; primary amines such as ethylamine and n-propylamine; secondary amines such as diethylamine and di-n-propylamine; tertiary amines such as triethylamine and methyldiethylamine; alcohol amines such as dimethylethanolamine and triethanolamine; and quaternary ammonium salts such as tetramethylammonium hydroxide (TMAH) and tetraethylammonium hydroxide. The aqueous alkali solution may be an aqueous solution containing an appropriate amount of an added water-soluble organic solvent or surfactant as appropriate. Since contamination by alkali metals is undesirable for electronic components, an aqueous tetramethylammonium hydroxide solution is preferred as the developing solution.

The preferred developing time will differ depending on the film thickness and solvent, but in most cases it is preferably from 5 seconds to 5 minutes, more preferably from 30 seconds to 3 minutes and most preferably from 30 seconds to 1 minute. If the developing time is shorter than 5 seconds it may be difficult to control the time on the total surface of the wafer or substrate, while if it is longer than 5 minutes the productivity may be lower. The treatment temperature for development will generally be 20-30° C. The developing method may be, for example, a spray, paddle, immersion or ultrasonic system. The pattern formed by development may subsequently be rinsed with distilled water or the like if necessary.

The patterned cured film of the invention may be also used directly as a resist mask.

In cases where the patterned cured film of the invention is in the form of a residual interlayer insulating film or clad layer, the coating may be fired at a heating temperature of, for example, 100-500° C. for final curing. The final curing is preferably carried out in an inert atmosphere of $N_2$, Ar, He or the like, in air or under reduced pressure, but there are no particular restrictions so long as it yields the properties required for the intended use. If the heating temperature is below 100° C. the curing may tend to be insufficient, leading to a poor electrical insulation property, whereas heating at a temperature of above 500° C. may result in deterioration of the underlying materials.

The heating time for the final curing is preferably 2-240 minutes and more preferably 2-120 minutes. A heating time of longer than 240 minutes may not be suitable for mass production. As heating apparatuses to be used there may be mentioned furnaces such as quartz tube furnaces, and heat treatment apparatuses such as hot plates and rapid thermal annealers (RTA).

Examples of electronic components employing the cured film described above include devices comprising insulating films, such as semiconductor elements, multilayer wiring boards and the like. Specifically, the cured film may be used as a surface protective film (passivation film), buffer coat film or interlayer insulating film for a semiconductor element. It may also be suitably used as an interlayer insulating film for a multilayer wiring board.

As examples of semiconductor elements there may be mentioned discrete semiconductors such as diodes, transistors, compound semiconductors, thermistors, varistors and thyristors, memory elements such as DRAM (Dynamic Random Access Memory), SRAM (Static Random Access Memory), EPROM (Erasable/Programmable Read Only Memory), Mask ROM (Mask Read Only Memory), EEPROM (Electrical/Erasable/Programmable Read Only Memory) and flash memory, logic circuit elements such as microprocessors, DSP and ASIC, integrated circuit elements such as compound semiconductors including MMIC (Monolithic Microsave Integrated Circuit), hybrid integrated circuits (hybrid IC), and photoelectric conversion elements such as light emitting diodes and charge coupled devices. As examples of multilayer wiring boards there may be mentioned high-density wiring boards such as MCM.

The cured film may also be used for liquid crystal parts, optical waveguides and photoresists, with no particular limitation to these.

FIG. 1 is a schematic edge-on view of an embodiment of a TFT (Thin-Film Transistor) according to the invention, as an electronic component for installation in a TFT liquid crystal display. In this TFT, a conduction layer 3 made of polysilicon is formed on an undercoat film 2 formed on a glass substrate 1, and a source 4 and drain 5 are situated sandwiching the conduction layer 3 in the in-plane direction. A gate electrode 7 is provided on the conduction layer 3 via a gate oxidation film 6 composed of $SiO_2$. The gate oxidation film 6 is formed in such a manner as to prevent direct contact between the conduction layer 3 and the gate electrode 7. The undercoat layer 2, conduction layer 3, source 4, drain 5, gate oxidation film 6 and gate electrode 7 are covered with a first interlayer insulating film 8 to prevent shorting, and portions of the first interlayer insulating film 8 are removed during formation of the TFT, with metal wirings 9 extending from those portions to connect with the source 4 and drain 5, respectively. The portion of the metal wiring 9 extending to connect to the drain 5 is electrically connected to a transparent electrode 11, while the remaining portion is covered with a second interlayer insulating film 10 to prevent shorting.

The cured film obtained from the radiation curable composition of the invention is provided in the TFT primarily as the second interlayer insulating film 10, but it may also be used as the first interlayer insulating film 8. The interlayer insulating films 8,10 may be formed in the following manner, for example. First, the radiation curable composition of the invention is applied onto a substrate by a spin coating method and dried to obtain a coating. Next, the coating is exposed through a mask having the desired pattern for curing of the desired sections (in the case of the first interlayer insulating film 8, the sections other than the sections on which the metal wiring 9 is to be formed, or in the case of the second interlayer insulating film 10, the sections other than the sections on which the transparent electrode 11 is to be formed), and then further subjected to heat treatment if necessary. The unexposed sections are removed by developing treatment to obtain interlayer insulating films 8,10. This may be followed by heat treatment if necessary for final curing. The interlayer insulating films 8,10 may have the same composition or different compositions.

EXAMPLES

Concrete examples of the present invention will now be explained, with the understanding that the invention is in no way limited to these examples.

Each of the examples was carried out in an environment without the photosensitive wavelength of the photoacid generator or photobase generator and sensitizing agent used until completion of the development step for the radiation curable composition, to avoid exciting the photoacid generator or photobase generator.

Example 1

To a solution of 317.9 g of tetraethoxysilane and 247.9 g of methyltriethoxysilane in 1116.7 g of diethyleneglycol dimethyl ether there was added dropwise 167.5 g of nitric acid, prepared to 0.644 wt %, over a period of 30 minutes while stirring. After completion of the dropwise addition, reaction was conducted for 3 hours and then a portion of the produced ethanol and the diethyleneglycol dimethyl ether were distilled off under reduced pressure in a warm bath to obtain 1077.0 g of a polysiloxane solution. To 525.1 g of the polysiloxane solution there was added 74.9 g of diethyleneglycol dimethyl ether, and the mixture was dissolved by 30 minutes of stirring at room temperature (25° C.) to obtain a polysiloxane solution for a radiation curable composition. The weight-average molecular weight of the polysiloxane was 870 as measured by GPC. Next, 0.150 g of a photoacid generator (PAI-1001, product of Midori Kagaku) was added to 10.0 g of the radiation curable composition polysiloxane solution to prepare a radiation curable composition. The amount of component (a) used was 15 wt % with respect to the total radiation curable composition, and the amount of component (b) used was 1.5 wt % with respect to the total radiation curable composition.

Figure 2:
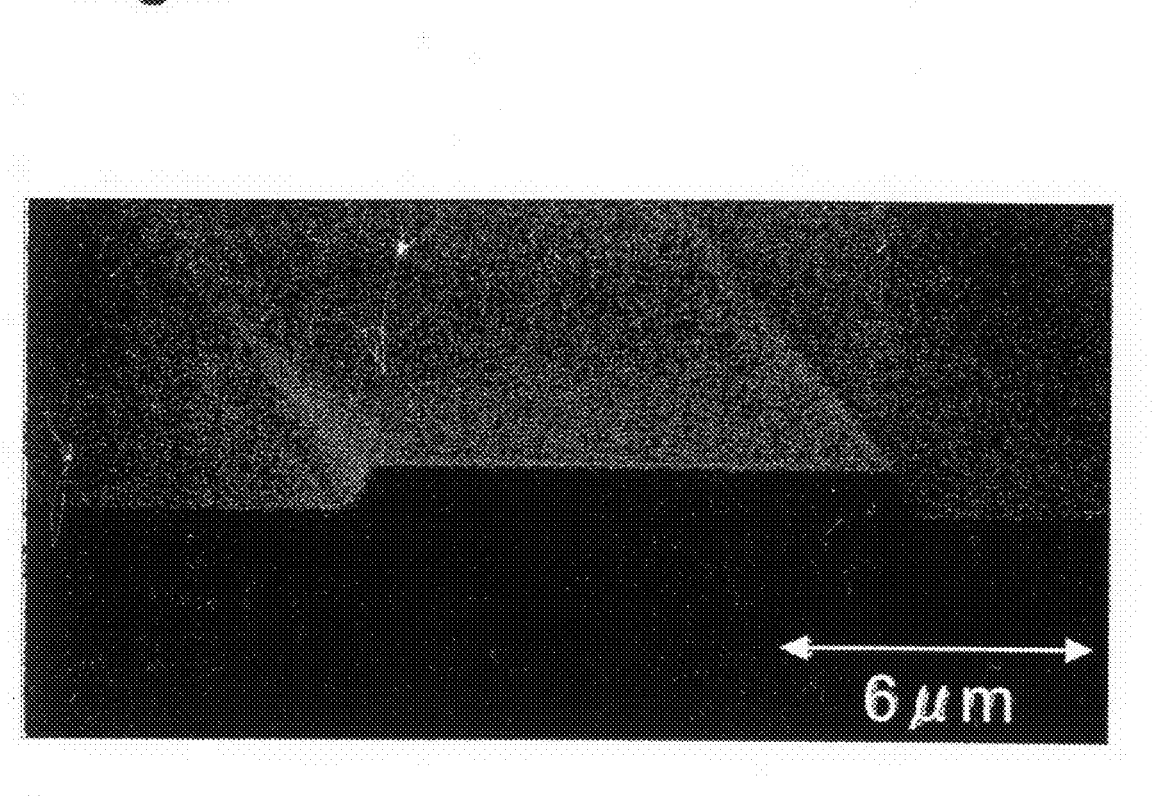
FIG. 2 is an SEM photograph showing a pattern shape according to an example of the invention.

A 2 mL portion of the radiation curable composition was added dropwise onto the center of a 5-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 200 mJ/cm$^2$ using an exposing apparatus (PLA-600F, Canon) through a negative mask bearing a line pattern with a minimum line width of 10 μm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, to dissolve the unexposed sections. The wafer was then washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that the lines had been precisely formed, with a pattern precision of 10 μm. A cross-sectional SEM photograph is shown in FIG. 2.

Example 2

To a solution of 317.9 g of tetraethoxysilane and 247.9 g of methyltriethoxysilane in 1116.7 g of diethyleneglycol dimethyl ether there was added dropwise 167.5 g of nitric acid, prepared to 0.644 wt %, over a period of 30 minutes while stirring. After completion of the dropwise addition, reaction was conducted for 3 hours and then a portion of the produced ethanol and the diethyleneglycol dimethyl ether were distilled off under reduced pressure in a warm bath to obtain 1077.0 g of a polysiloxane solution. To 525.1 g of the polysiloxane solution there was added 53.0 g of diethyleneglycol dimethyl ether, a tetramethylammonium nitrate aqueous solution prepared to 2.38 wt % (pH 3.6) and 3.0 g of water, and the mixture was dissolved by 30 minutes of stirring at room temperature (25° C.) to obtain a polysiloxane solution for a radiation curable composition. The weight-average molecular weight of the polysiloxane was 830 as measured by GPC. Next, 0.193 g of a photoacid generator (PAI-1001, product of Midori Kagaku) was added to 10.0 g of the radiation curable composition polysiloxane solution to prepare a radiation curable composition. The amount of component (a) used was 15 wt % with respect to the total radiation curable composition, the amount of component (b) used was 1.9 wt % with respect to the total radiation curable composition, and the amount of component (d) used was 0.075 wt % with respect to the total radiation curable composition.

A 2 mL portion of the radiation curable composition was added dropwise onto the center of a 5-inch silicon wafer and subjected to spin coating (30 seconds of rotation at 700 rpm) to form a coating on the wafer, and this was dried for 30 seconds on a 70° C. hot plate. Next, the dried coating was exposed to ultraviolet rays at 200 mJ/cm$^2$ using an exposing apparatus (PLA-600F, Canon) through a negative mask bearing a line pattern with a minimum line width of 10 μm. The wafer carrying the exposed coating was immersed for 30 seconds in a developing solution comprising a 2.38 wt % tetramethylammonium hydroxide (TMAH) aqueous solution, to dissolve the unexposed sections. The wafer was then washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that the lines had been precisely formed, with a pattern precision of 10 μm.

Example 3

To a solution of 74.77 g of tetraethoxysilane and 128.68 g of methyltriethoxysilane in 437.86 g of cyclohexanone there was added dropwise 58.71 g of nitric acid, prepared to 0.644 wt %, over a period of 10 minutes while stirring. After completion of the dropwise addition, reaction was conducted for 3 hours and then a portion of the produced ethanol and the cyclohexanone were distilled off under reduced pressure in a warm bath to obtain 343.62 g of a polysiloxane solution for a radiation curable composition. The weight-average molecular weight of the polysiloxane was 1020 as measured by GPC. Next, 0.042 g of a photoacid generator (PAI-101, product of Midori Kagaku) was added to 5.0 g of the radiation curable composition polysiloxane solution to prepare a radiation curable composition. The amount of component (a) used was 20 wt % with respect to the total radiation curable composition, and the amount of component (b) used was 0.8 wt % with respect to the total radiation curable composition.

A 2 mL portion of the radiation curable composition was added dropwise onto the center of a 6-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 100 mJ/cm$^2$ using an exposing apparatus (FPA-3000 iW, Canon) through a negative mask bearing a line pattern with a minimum line width of 2 μm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, for paddle development to dissolve the unexposed sections. The wafer was then washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that the lines had been precisely formed, with a pattern precision of 2 μm.

Example 4

To a solution of 96.13 g of tetraethoxysilane and 165.44 g of methyltriethoxysilane in 562.99 g of propyleneglycol methyl ether acetate there were added dropwise 75.47 g of nitric acid, prepared to 0.644 wt % and 18.9 g of a tetramethylammonium nitrate aqueous solution prepared to 2.38 wt % (pH 3.6), over a period of 5 minutes while stirring. After completion of the dropwise addition, reaction was conducted for 3 hours and then a portion of the produced ethanol and the propyleneglycol methyl ether acetate were distilled off under reduced pressure in a warm bath to obtain 359.94 g of a polysiloxane solution. Propyleneglycol methyl ether acetate was then added thereto to obtain 450.02 g of a polysiloxane solution for a radiation curable composition. The weight-average molecular weight of the polysiloxane was 1110 as measured by GPC. Next, 0.080 g of a photoacid generator (PAI-101, product of Midori Kagaku) was added to 20.0 g of the radiation curable composition polysiloxane solution to prepare a radiation curable composition. The amount of component (a) used was 20 wt % with respect to the total radiation curable composition, the amount of component (b) used was 0.4 wt % with respect to the total radiation curable composition, and the amount of component (d) used was 0.1 wt % with respect to the total radiation curable composition.

Figure 3:
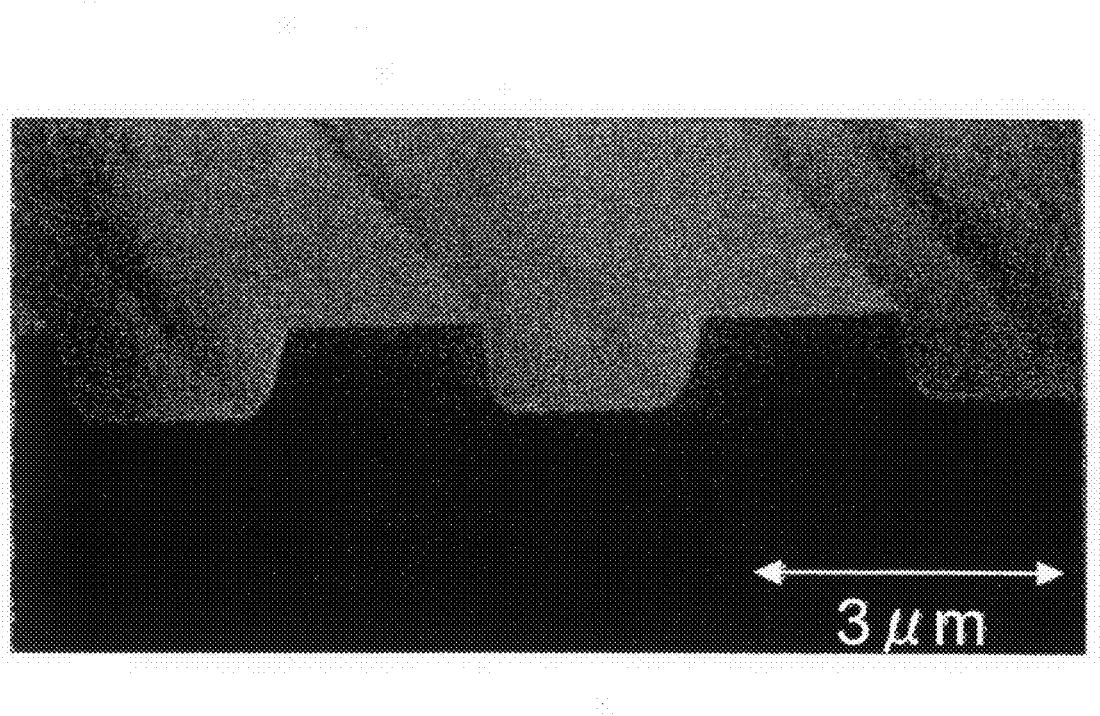
FIG. 3 is an SEM photograph showing a pattern shape according to an example of the invention.

A 2 mL portion of the radiation curable composition was added dropwise onto the center of a 6-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 75 mJ/cm$^2$ using an exposing apparatus (FPA-3000 iW, Canon) through a negative mask bearing a line pattern with a minimum line width of 2 μm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, for paddle development using a coater/developer (Mark 7, product of Tokyo Electron) to dissolve the unexposed sections. The wafer was then washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that the lines had been precisely formed, with a pattern precision of 2 μm. A cross-sectional SEM photograph is shown in FIG. 3.

Example 5

To 10.0 g of the radiation curable composition polysiloxane solution obtained in Example 4 there was added 0.040 g of a photobase generator (NBC-101, product of Midori Kagaku), to prepare a radiation curable composition. The amount of component (a) used was 20 wt % with respect to the total radiation curable composition, the amount of component (b) used was 0.4 wt % with respect to the total radiation curable composition, and the amount of component (d) used was 0.1 wt % with respect to the total radiation curable composition.

A 2 mL portion of the radiation curable composition was added dropwise onto the center of a 6-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 100 mJ/cm$^2$ using an exposing apparatus (FPA-3000 iW, Canon) through a negative mask bearing a line pattern with a minimum line width of 2 μm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, for paddle development using a coater/developer (Mark 7, product of Tokyo Electron) to dissolve the unexposed sections. The wafer was then washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that the lines had been precisely formed, with a pattern precision of 2 μm.

Example 6

To 10.0 g of the radiation curable composition polysiloxane solution obtained in Example 4 there was added 0.040 g of a photoacid generator (PAI-101, product of Midori Kagaku) and 0.5 g of polypropylene glycol (PPG725 by Aldrich) as a thermal decomposing compound, to prepare a radiation curable composition. The amount of component (a) used was 20 wt % with respect to the total radiation curable composition, the amount of component (b) used was 0.4 wt % with respect to the total radiation curable composition, and the amount of component (d) used was 0.1 wt % with respect to the total radiation curable composition.

A 2 mL portion of the radiation curable composition was added dropwise onto the center of a 6-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 100 mJ/cm$^2$ using an exposing apparatus (FPA-3000 iW, Canon) through a negative mask bearing a line pattern with a minimum line width of 2 μm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, for paddle development using a coater/developer (Mark 7, product of Tokyo Electron) to dissolve the unexposed sections. The wafer was then washed and spin dried. A furnace body was used for heating of the spin dried wafer at 350° C. for 30 minutes in a nitrogen atmosphere, to obtain a radiation cured film on the wafer. The film thickness of the radiation cured film was 3.0 μm, and yet no cracking or other problems were found. Upon observing the pattern shape of the radiation cured film from the top using an optical microscope and observing the cross-sectional shape using a SEM, it was found that the lines had been precisely formed, with a pattern precision of 2 μm.

Comparative Example 1

To a solution of 132.31 g of tetraethoxysilane and 103.19 g of methyltriethoxysilane in 464.79 g of propyleneglycol monomethyl ether there were added dropwise 69.73 g of nitric acid, prepared to 0.644 wt %, over a period of 10 minutes while stirring. After completion of the dropwise addition, reaction was conducted for 3 hours and then a portion of the produced ethanol and the propyleneglycol monomethyl ether were distilled off under reduced pressure in a warm bath to obtain 487.79 g of a polysiloxane solution. Next, 16.5 g of a tetramethylammonium nitrate aqueous solution prepared to 2.38 wt % (pH 3.6) was then added dropwise over a period of 5 minutes while stirring to obtain a polysiloxane solution for a radiation curable composition. The weight-average molecular weight of the polysiloxane was 1040 as measured by GPC. Next, 0.150 g of a photoacid generator (PAI-1001, product of Midori Kagaku) was added to 10.0 g of the radiation curable composition polysiloxane solution to prepare a radiation curable composition. The amount of component (a) used was 15 wt % with respect to the total radiation curable composition, the amount of component (b) used was 1.5 wt % with respect to the total radiation curable composition, and the amount of component (d) used was 0.08 wt % with respect to the total radiation curable composition.

A 2 mL portion of the radiation curable composition was added dropwise onto the center of a 5-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 200 mJ/cm$^2$ using an exposing apparatus (PLA-600F, Canon) through a negative mask bearing a line pattern with a minimum line width of 10 µm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, to dissolve the unexposed sections. When the wafer was washed and spin dried, the entire coating dissolved leaving no discernible pattern shape.

Comparative Example 2

Figure 4:
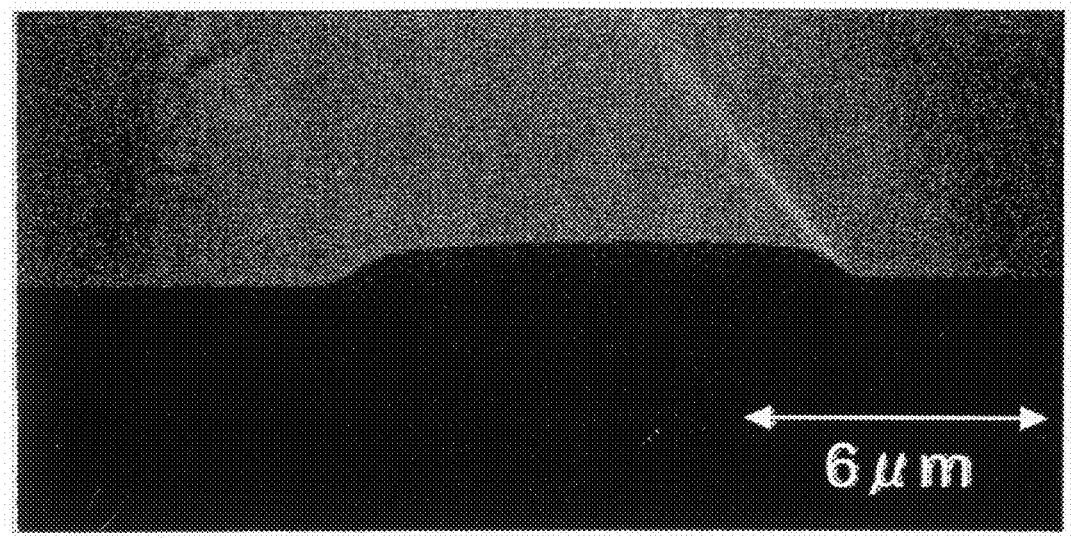
FIG. 4 is an SEM photograph showing a pattern shape according to a comparative example of the invention.

The procedure was carried out in the same manner as Comparative Example 1 up to development, except that the ultraviolet exposure dose of 200 mJ/cm$^2$ was changed to 1000 mJ/cm$^2$. After development, the wafer was washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that 10 µm-width lines were formed but the shape was unsatisfactory. A cross-sectional SEM photograph is shown in FIG. 4.

Comparative Example 3

To a solution of 44.86 g of tetraethoxysilane, 77.22 g of methyltriethoxysilane and 0.88 g of a tetramethylammonium nitrate aqueous solution prepared to 2.38 wt % (pH 3.6) in 122.72 g of ethanol there was added dropwise 35.22 g of nitric acid, prepared to 0.644 wt %, over a period of 10 minutes while stirring. After completion of the dropwise addition, reaction was conducted for 3 hours and then a portion of the produced ethanol was distilled off under reduced pressure in a warm bath to obtain 205.74 g of a polysiloxane solution for a radiation curable composition. The weight-average molecular weight of the polysiloxane was 870 as measured by GPC.

Next, 0.150 g of a photoacid generator (PAI-1001, product of Midori Kagaku) was added to 10.0 g of the radiation curable composition polysiloxane solution, but no dissolution occurred. The amount of component (a) used was 20 wt % with respect to the total radiation curable composition, the amount of component (b) used was 1.5 wt % with respect to the total radiation curable composition, and the amount of component (d) used was 0.01 wt % with respect to the total radiation curable composition.

Comparative Example 4

To a solution of 128.87 g of tetraethoxysilane and 100.51 g of methyltriethoxysilane in 229.97 g of propyleneglycol monomethyl ether there was added dropwise 67.91 g of nitric acid, prepared to 0.644 wt %, over a period of 10 minutes while stirring. After completion of the dropwise addition, reaction was conducted for 3 hours to obtain 527.26 g of a polysiloxane solution for a radiation curable composition. The weight-average molecular weight of the polysiloxane was 980 as measured by GPC. Next, 0.150 g of a photoacid generator (PAI-1001, product of Midori Kagaku) was added to 10.0 g of the radiation curable composition polysiloxane solution, to obtain a radiation curable composition. The amount of component (a) used was 15 wt % with respect to the total radiation curable composition, and the amount of component (b) used was 1.5 wt % with respect to the total radiation curable composition.

A 2 mL portion of the radiation curable composition was added dropwise onto the center of a 5-inch silicon wafer and subjected to spin coating (30 seconds of rotation at 700 rpm) to form a coating on the wafer, and this was dried for 30 seconds on a 100° C. hot plate. Next, the dried coating was exposed to ultraviolet rays at 200 mJ/cm$^2$ using an exposing apparatus (PLA-600F, Canon) through a negative mask bearing a line pattern with a minimum line width of 10 µm. The wafer carrying the exposed coating was heated on a 100° C. hot plate for 30 seconds and then allowed to cool naturally until the wafer reached room temperature, after which the wafer was immersed for 30 seconds in a developing solution comprising a 2.38 wt % tetramethylammonium hydroxide (TMAH) aqueous solution, to dissolve the unexposed sections. When the wafer was then washed and spin dried, the entire coating dissolved leaving no discernible pattern shape.

Comparative Example 5

Figure 5:
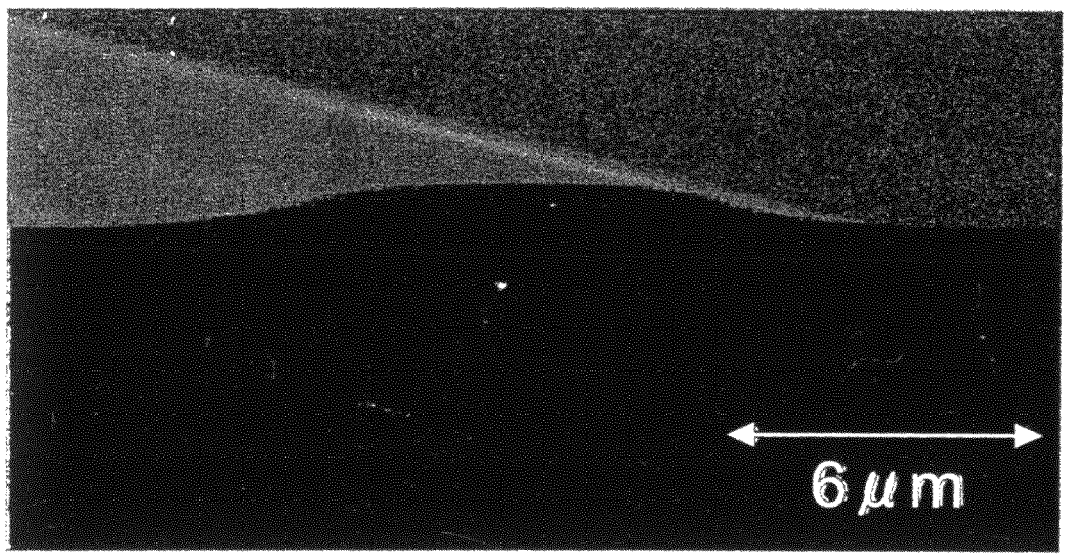
FIG. 5 is an SEM photograph showing a pattern shape according to a comparative example of the invention.

The procedure was carried out in the same manner as Comparative Example 4 up to development, except that the ultraviolet exposure dose of 200 mJ/cm$^2$ was changed to 1000 mJ/cm$^2$. After development, the wafer was washed and spin dried. A furnace body was used for heating of the spin dried wafer at 350° C. for 30 minutes in a nitrogen atmosphere, to obtain a radiation cured film on the wafer. Upon observing the pattern shape of the radiation cured film from the top using an optical microscope and observing the cross-sectional shape using a SEM, it was found that 10 µm-width lines were formed but the shape was unsatisfactory. A cross-sectional SEM photograph is shown in FIG. 5.

Comparative Example 6

To a solution of 44.90 g of tetraethoxysilane and 77.20 g of methyltriethoxysilane in 122.75 g of ethanol there was added dropwise 35.24 g of nitric acid, prepared to 0.644 wt %, over a period of 10 minutes while stirring. After completion of the dropwise addition, reaction was conducted for 3 hours and then a portion of the produced ethanol was distilled off under reduced pressure in a warm bath to obtain 210.05 g of a polysiloxane solution for a radiation curable composition. The weight-average molecular weight of the polysiloxane was 910 as measured by GPC. Next, 0.150 g of a photoacid generator (PAI-1001, product of Midori Kagaku) was added to 10.0 g of the radiation curable composition polysiloxane solution, but no dissolution occurred. The amount of component (a) used was 20 wt % with respect to the total radiation curable composition, and the amount of component (b) used was 1.5 wt % with respect to the total radiation curable composition.

The results for Examples 1-6 and Comparative Examples 1-6 are shown in Table 1.

TABLE 1

| | Aprotic solvent | Curing acceleration catalyst | Exposure dose (mJ/cm$^2$) | PEB temperature (° C.) | Pattern precision (μm) | Pattern shape |
|---|---|---|---|---|---|---|
| Example 1 | present | absent | 200 | 100 | 10 | good |
| Example 2 | present | present | 100 | None | 10 | good |
| Example 3 | present | absent | 100 | 100 | 2 | good |
| Example 4 | present | present | 75 | 100 | 2 | good |
| Example 5 | present | present | 100 | 100 | 2 | good |
| Example 6 | present | present | 100 | 100 | 2 | good |
| Comp. Ex. 1 | absent | present | 200 | 100 | no pattern formed | |
| Comp. Ex. 2 | absent | present | 1000 | 100 | 10 | poor |
| Comp. Ex. 3 | absent | present | no dissolution of photoacid generator | | | |
| Comp. Ex. 4 | absent | absent | 200 | 100 | no pattern formed | |
| Comp. Ex. 5 | absent | absent | 1000 | 100 | 10 | poor |
| Comp. Ex. 6 | absent | absent | no dissolution of photoacid generator | | | |

Example 7

When the radiation curable composition obtained in Example 3 was stored for 30 days in an atmosphere at −20° C., the storage stability was superior compared to storage of the same radiation curable composition for 30 days in an atmosphere at ordinary temperature. The radiation curable composition stored in an atmosphere at −20° C. was successfully patterned even after storage for 30 days, but the radiation curable composition stored for 30 days in an atmosphere at ordinary temperature could not be patterned even after 7 days. This is attributed to progressive condensation of the siloxane resin, with concomitant production of water, in the radiation curable composition stored for 7 days in an atmosphere at ordinary temperature.

According to the radiation curable composition, method for its storage, forming method of a cured film and patterning method of the invention, it is possible to obtain cured films with excellent pattern precision even with a relatively low exposure dose. The invention is therefore useful for uses of a pattern, electronic components and optical waveguides.

What is claimed is:

1. A patterning method comprising steps of:
applying a radiation curable composition containing a siloxane resin onto a substrate and drying the composition to obtain a coating,
exposing said coating to irradiation of light at a dose of 5-100 mJ/cm$^2$ via a mask, and
removing the unexposed sections of said coating by development, wherein the siloxane resin is dissolved in an aprotic solvent containing ether-based solvent or ether acetate-based solvent, and
wherein the siloxane resin includes a resin obtainable by hydrolytic condensation of a compound represented by the following general formula (8), an oligomer of compounds represented by the general formula (8) and/or a partial condensate of compounds represented by the general formula (8):

$$SiX_4 \quad (8)$$

wherein X represents a hydrolyzable group, and
wherein said resin obtainable by hydrolytic condensation includes a resin obtainable by hydrolytic condensation of a compound represented by the following general formula (1), an oligomer of compounds represented by general formula (1) and/or a partial condensate of compounds represented by general formula (1):

$$R^1{}_n SiX_{4-n} \quad (1)$$

wherein R$^1$ represents an H or F atom, a group containing a B, N, Al, P, Si, Ge or Ti atom, or a C1-20 organic group, X represents a hydrolyzable group and n represents an integer of 1-2, with the proviso that when n is 2, each R$^1$ may be the same or different, and when n is 1-2, each X may be the same or different.

2. The patterning method according to claim 1, wherein a total proportion of the one or more atoms selected from the group consisting of H, F, B, N, Al, P, Si, Ge, Ti and C atoms bonding to one Si atom with respect to the Si atom of the resin obtainable by hydrolytic condensation is from 0.90 to 0.20.

3. The patterning method according to claim 1, wherein the R$^1$ contains one or more atoms selected from the group consisting of H, F, N, Si, Ti and C.

4. The patterning method according to claim 1, wherein R$^1$ contains one or more atoms selected from the group consisting of H, F, N, Si, and C.

5. The patterning method according to claim 1, wherein a total proportion of the one or more atoms selected from the group consisting of H, F, B, N, Al, P, Si, Ge, Ti and C atoms bonding to one Si atom with respect to the Si atom of the resin obtainable by hydrolytic condensation is from 0.80 to 0.20.

6. The patterning method according to claim 1, wherein said radiation curable composition contains said siloxane resin and an acid generator.

7. The patterning method according to claim 1, wherein the unexposed sections of said coating are removed without heating of the coating after said exposure step.

\* \* \* \* \*